United States Patent

Robinson

[15] 3,650,019

[45] Mar. 21, 1972

[54] METHODS OF MANUFACTURING SEMICONDUCTOR DEVICES

[72] Inventor: David Phythian Robinson, Stanmore, England

[73] Assignee: U.S. Philips Corporation

[22] Filed: Dec. 29, 1969

[21] Appl. No.: 888,543

[30] Foreign Application Priority Data

Dec. 31, 1968 Great Britain ......................61,953/68

[52] U.S. Cl. ....................................29/571, 29/578, 29/584, 148/1.5

[51] Int. Cl. ....................................B01j 17/00, H01g 13/00

[58] Field of Search....................29/571, 578, 584, 585, 586, 29/576 B

[56] References Cited

UNITED STATES PATENTS 3,328,210 6/1967 McCaldin et al.....................29/584 X
3,470,609 10/1969 Breitweiser..............................29/571
3,481,031 12/1969 Klasens...................................29/571
3,558,366 1/1971 Lepselter.............................29/578 X

*Primary Examiner*—John F. Campbell
*Assistant Examiner*—W. Tupman
*Attorney*—Frank R. Trifari

[57] ABSTRACT

A method of implanting ions in a semiconductor body in which a thin conductive layer is applied on the surface parts or surface adjacent parts at which the ion beam is to be directed. The ions penetrate the thin layer which maintains the surface parts or surface adjacent parts, including metal electrode layers when present, at a common potential. By suitable connection of the thin layer charging of said parts during implantation can be prevented. Subsequent to implantation the thin conductive layer is removed without effecting any substantial removal of the surface parts or surface adjacent parts. The specification describes the manufacture of a tetrode insulated gate field effect transistor, the applied thin conductive layer preventing charging of the gate electrodes and consequent breakdown of the underlying insulating layers during ion implantation.

20 Claims, 5 Drawing Figures

DAVID PHYTHIAN ROBINSON
INVENTOR.
BY Frank R. Trifari
AGENT.

DAVID PHYTHIAN ROBINSON
INVENTOR.

BY Frank R. Trifari
AGENT.

DAVID PHYTHIAN ROBINSON
INVENTOR.

BY Frank R. Trifari
AGENT.

METHODS OF MANUFACTURING SEMICONDUCTOR DEVICES

This invention relates to methods of manufacturing semiconductor devices, particularly but not exclusively insulated gate field effect transistors, in which ions of an impurity element are implanted in a semiconductor body to form regions of different electrical properties in the semiconductor body, and further relates to devices when manufactured by such methods.

In the manufacture of semiconductor devices the technique of ion implantation in which a beam of energetic dopant ions is directed at a semiconductor body to form regions of different electrical properties in the body is becoming of increasing importance. Ion implantation may be used in certain applications as an alternative to diffusion processes in which an impurity element is diffused into the body from the vapour phase or in applications where a desired structure in the semiconductor body cannot be obtained readily by such diffusion techniques. One of the earliest applications of ion implantation in the semiconductor art was in the manufacture of solar cells and more recently the use of ion implantation has been proposed for bipolar transistors and insulated gate field effect transistors. One particular use of ion implantation techniques in the manufacture of insulated gate field effect transistors is described in French Pat. No. 1,577,669. This technique involves the definition of at least the adjacent extremities of source and drain regions and the location therebetween of the current carrying channel region by implanting in a semiconductor body of one conductivity type ions of an impurity element characteristic of the opposite conductivity type using a previously applied insulated gate electrode metal layer as a mask during the implantation. In this method outer parts of the source and drain regions are formed initially by diffusion or ion implantation. Thereafter openings are made in an insulating layer on the semiconductor body surface and source and drain electrode metal layers applied in the openings and a gate electrode metal layer provided on the insulating layer between, but not overlapping, the source and drain region outer parts. Implantation is then effected preferably through the insulating layer parts not covered by the electrode metal layers which act as a mask. This implantation step extends the source and drain regions towards each other and defines therebetween a current carrying channel region having a length corresponding substantially to the lateral dimension of the overlying insulated gate electrode metal layer. The method is referred to as Auto-Registration and its main advantage resides in the provision of an insulated gate field effect transistor having a very low gate to drain capacitance because the overlap of the gate electrode with the drain region is very small compared with an insulated gate field effect transistor structure in which the source and drain regions are formed solely by diffusion techniques. Also channel regions of precisely controlled dimensions and small length may be obtained by this method.

One problem arising in the above-described Auto-Registration method concerns the undesirable effect of the charging of the electrode metal layers during the implantation. In this context it is particularly important that charge does not build up to a significant extent on the gate electrode metal layer because this may lead to subsequent breakdown of the insulating layer between the gate electrode metal layer and the underlying portion of the semiconductor body. To prevent this charging it is possible to only partially define the source, drain and gate electrode metal layers prior to implantation, that is, to form these layers from a common metal layer and define the common layer by a photo-masking and etching step and leave an outer portion connecting the individual metal layer parts. During the ion implantation the individual metal layer parts may thus be maintained at the same potential as a substrate part of the semiconductor body, for example at earth potential by connecting the outer portion of the common metal layer and the substrate part to an earthing point on the ion accelerator. Subsequent to ion implantation a further photo-masking and etching step is carried out to define finally the common metal layer and to separate the source, drain and gate electrode metal layer parts from the outer connecting portion. This method of preventing the charging of the electrodes is quite workable for insulated gate field effect structure having a simple electrode geometry but it does involve a further photomasking and etching step after ion implantation. Furthermore for more complex insulated gate field effect transistor structures the described method of preventing charging of the electrodes cannot always be used. This is particularly the case for some double gate or so-called tetrode insulated field effect transistors. A tetrode insulated gate field effect transistor is described in the applicants British Pat. specification No. 1,037,850 and comprises an intermediate region of the opposite conductivity type in the semiconductor body of one conductivity type and situated between the source and drain regions of the opposite conductivity type. A first, signal insulated gate electrode is associated with the current carrying channel region between the source region and the intermediate region and a second, screening insulated gate electrode is associated with a current carrying channel region between the intermediate region and the drain region. This device may have a relatively low feedback capacitance. It is possible to use the described method of auto-registration in the manufacture of such a tetrode insulated gate field effect transistor. However the latter described method of preventing the charging of the electrodes is not readily adaptable to such a structure since the connection portions of the composite metal layer including the source, drain and gate electrode parts will mask against implantation in the underlying parts in the semiconductor body and these connection portions due to the more complex gate electrode structure may be situated above surface parts of the body where it is desired to implant the ions.

According to the invention a method of manufacturing a semiconductor device in which ions of an impurity element are implanted in a semiconductor body to form regions of different electrical properties in the body comprises the steps of initially applying on the surface parts or surface adjacent parts at which the ions are to be directed a continuous conductive layer for maintaining said parts at a common potential during ion implantation, implanting by directing at said continuous conductive layer ions having a given energy sufficient to penetrate the continuous conductive layer and further pass into parts of the semiconductor body, and thereafter removing at least part of the continuous conductive layer without substantially effecting any removal of said surface parts.

This method provides a relatively simple means of preventing said surface parts or surface adjacent parts charging during ion implantation because the continuous conductive layer applied for maintaining said parts at a common potential can be readily connected at a suitable potential, for example at earth potential by connecting to an earthing point on the ion accelerator. Furthermore the method permits relatively complex electrode layer structures to be defined at the surface prior to implantation and the necessity of a further step to define the metal electrode layers after implantation no longer arises.

In a preferred form of the method during ion implantation the continuous conductive layer is maintained at the same potential as a substrate portion of the semiconductor body. Normally the substrate portion of a semiconductor body will be maintained at earth potential by the connection of said substrate portion to an earthing point on the ion accelerator.

Said surface adjacent parts at which ions are directed may include metal electrode layers on the semiconductor surface and/or a metal electrode layer situated on an insulating layer on the semiconductor surface, the applied continuous conductive layer maintaining said electrode layers at a constant potential during ion implantation. The extent of each metal electrode layer may be substantially completely determined prior to applying the continuous conductive layer and the subsequent ion implantation, the removal of the continuous conductive layer after ion implantation re-exposing said metal electrode layers. Thus compared with the previously described method of preventing charging of the metal electrode layers in which said layers are only partially defined prior to implantation, this form of the method in accordance with the invention has the advantage that a further photomasking step after implantation may not be necessary.

The metal electrode layers may be of such composition and thickness that the ions of the said given energy do not penetrate these layers which act as a mask during ion implantation.

On the semiconductor surface situated laterally between the metal electrode layers there may be an insulating layer of such composition and thickness that ions of the said given energy which penetrate the overlying continuous conductive layer further penetrate the insulating layer and pass into the semiconductor body to form the regions of different electrical properties. In one form of the method in accordance with the invention the semiconductor device manufactured in an insulated gate field effect transistor, the metal electrode layers constituting source and drain electrodes in contact with the semiconductor body and at least one gate electrode insulated from the semiconductor body, the implantation in the semiconductor body of one conductivity type of ions of an impurity element characteristic of the opposite conductivity type being effected to determine the adjacent extremities of source and drain regions of the opposite conductivity type and the location therebetween of at least one current carrying channel region having a length corresponding substantially to the lateral dimension of the overlying insulated gate electrode. Thus the method in accordance with the invention may be suitably employed in Auto-Registration methods of manufacturing insulated gate field effect transistors.

In one particular form of the said method for forming an insulated gate field effect transistor which is of the so-called tetrode form, first and second gate electrode metal layers are present on the insulating layer, the implantation being effected to determine in the semiconductor body of one conductivity type at least the adjacent extremities of the source region and an intermediate region of the opposite conductivity type and the location therebetween of a first current carrying channel region having a length corresponding substantially to the lateral dimension of the overlying, first insulated gate electrode, and to determine in the semiconductor body at least the adjacent extremities of the intermediate region of the opposite conductivity type and the drain region and the location therebetween of a second current carrying channel region having a length corresponding substantially to the lateral dimension of the overlying, second insulated gate electrode. The implantation may be effected to determine substantially completely the intermediate region of the opposite conductivity type.

In the said methods in accordance with the invention in which an insulated gate field effect transistor is manufactured outer portions of the source and drain regions may be determined by a diffusion step prior to applying metal electrode layers and the ion implantation of the impurity element characteristic of the opposite conductivity type effected to extend the source and drain region portions towards each other in the semiconductor body. Alternatively the outer portions of the source and drain regions may be determined initially by an ion implantation step. Similarly the intermediate region in the tetrode insulated gate field effect transistor may have a first portion determined initially by a diffusion step and thereafter portions adjacent the extremities of the source and drain regions determined by the said ion implantation.

Electrical contact between the continuous conductive layer and the substrate portion of the semiconductor body may be made via a metal clip. Alternatively, prior to applying the continuous conductive layer a peripheral opening may be formed in an insulating layer present on the semiconductor surface to expose a substrate portion of the semiconductor body and the continuous conductive layer is applied in said peripheral opening. The peripheral opening may be in the form of a grid in the insulating layer on the semiconductor surface delineating a plurality of semiconductor body parts in each of which an individual circuit element or a plurality of interconnected circuit elements are formed.

The applied continuous conductive layer may be of metal or of semiconductor material. When it is of metal the metal electrode layers may be of the same metal, the continuous metal layer having a thickness which is appreciably smaller than that of the metal electrode layers and being removed by etching after the ion implantation. The etching is carried out so that removal of the continuous metal layer of smaller thickness is achieved without any substantial removal of the underlying metal electrode layers. The semiconductor body may be of silicon and the continuous metal layer and the metal electrode layers of aluminum.

The continuous metal layer may be of titanium and the metal electrode layers of a different metal. Thus in one form of the method in which the semiconductor body is of silicon the metal electrode layers consists of a first layer portion of molybdenum and a second layer portion of gold situated on the first layer portion, the continuous metal layer subsequently applied on the gold layer portion being of titanium.

In another form of the method in which the semiconductor body is of silicon, the continuous metal layer is of titanium and is applied prior to providing the metal electrode layers. The metal electrode layers in this case may be of a platinum/gold structure, that is, a first layer portion of platinum on the titanium layer and a second, outer layer of gold on the platinum layer. This method in which the continuous metal layer is applied prior to the electrode layers is relatively simple to perform. The platinum/gold layers are defined to form the electrode layers prior to implantation, which occurs through the exposed parts of the titanium layer. Thereafter the exposed parts of the titanium layer are removed.

An embodiment of the invention will now be described, by way of example, with reference to the accompanying diagrammatic drawings, in which.

Figure 1:
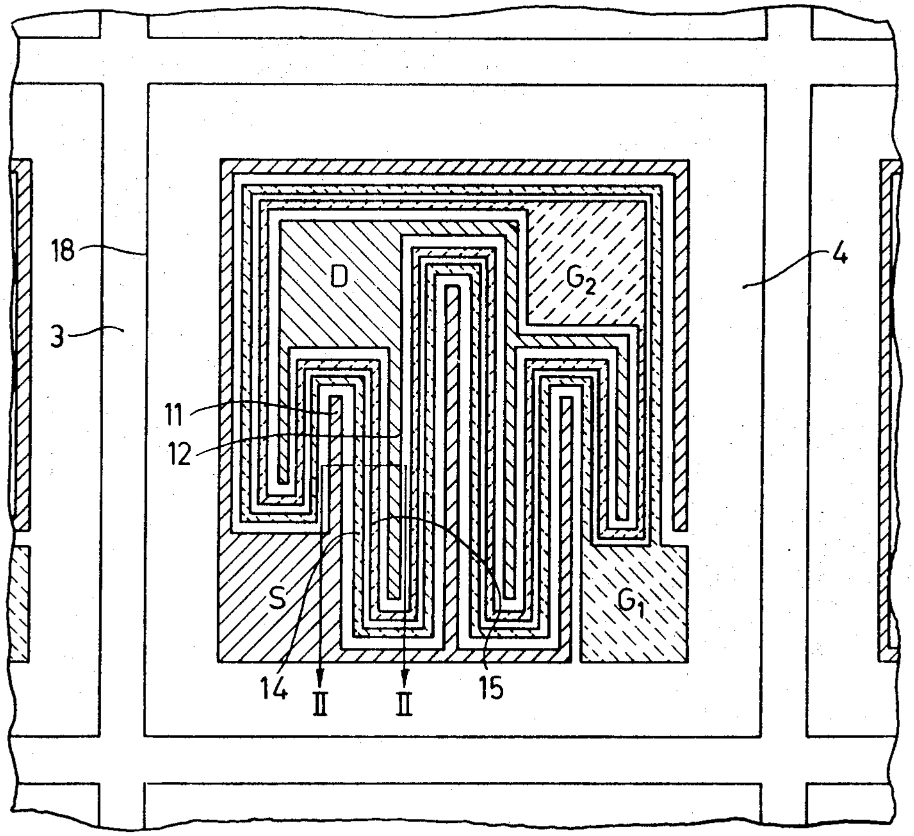
FIG. 1 shows part of a semiconductor wafer in which a plurality of tetrode silicon insulated gate field effect transistor sub-assemblies have been formed by a method in accordance with the invention.
Figure 2:
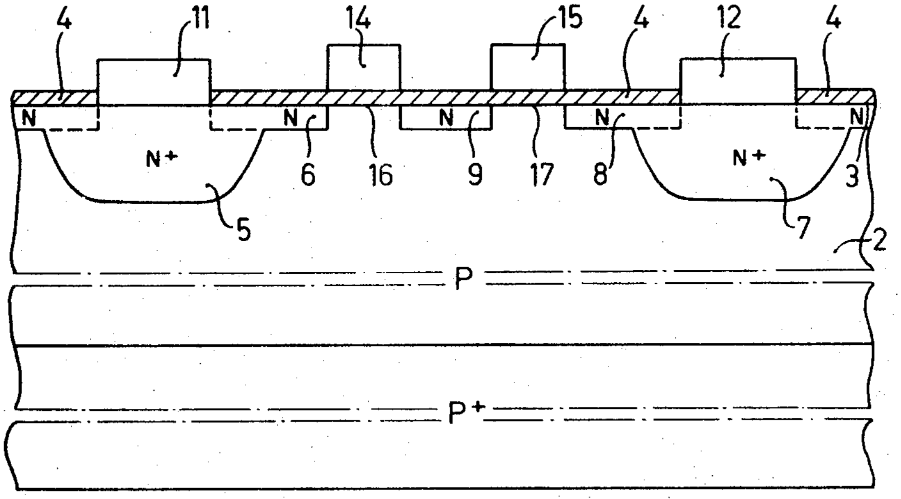
FIG. 2 is a cross-section through part of the semiconductor wafer shown in FIG. 1 and taken along the line II—II thereof.

Referring first to FIGS. 1 and 2, the semiconductor wafer is of a diameter of approximately 2.5 cm. and comprises a $p^+$-type substrate portion 1 of monocrystalline silicon of 0.01 ohm-cm. resistivity and of approximately 200 microns thickness. On the substrate portion 1 there is a P-type epitaxial layer of 10 ohm-cm. resistivity and approximately 10 microns thickness. On the surface 3 of the P-type epitaxial layer there is a thermally grown silicon oxide layer 4 of approximately 0.1 micron thickness. A plurality of approximately 1,000 tetrode insulated gate field effect transistors sub-assemblies are present in the epitaxial layer 2, each of which comprises an $n^+$-type source region 5, 6, and $n^+$-type drain region 7, 8, and an n-type intermediate region 9. A source electrode metal layer 11 forms ohmic contact with a surface part of the portion 5 of the source region, further extends over the insulating layer 4 and terminates on the insulating layer in an enlarged area bonding pad indicated by the character S in FIG. 1. A drain electrode metal layer 12 forms ohmic contact with a surface part of the portions 7 of the drain region, further extends over the insulating layer 4 and terminates on the insulating 4 in an enlarged area bonding pad indicated by the character D in FIG. 1. A first gate electrode metal layer 14 is situated on the insulating layer 4 between the adjacent extremities of the portion 6 of the source region and the intermediate region 9, further extends over the insulating layer 4 and terminates in an enlarged area bonding pad indicated by the character $G_1$, in FIG. 1. A second gate electrode 15 is situated on a part of the insulating layer 4 between the adjacent extremities of the portion 8 of the drain region and the intermediate region 9, further extends over the insulating layer 4 and terminates in an enlarged area bonding pad indicated by the character $G_2$ in FIG. 2.

The source region 5,6 comprises a diffused portion 5 containing a diffused concentration of phosphorus with the p-n junction between the portion 5 and the epitaxial layer 2 extending at a maximum depth in the epitaxial layer of approximately 2 microns from the surface 3, and an ion implanted portion 6 containing an implanted concentration of phosphorus with the p-n junction part between the portion 6 and at the epitaxial layer 2 extending in the layer 2 at a maximum depth of approximately 0.5 micron from the surface 3. Similarly the drain region 7, 8 comprises a diffused portion 7 containing a diffused concentration of phosphorus with the p-n junction between the portions 7 and the epitaxial layer 2 extending at a maximum depth in the epitaxial layer 2 of approximately 2 microns from the surface 3, and an ion implanted portion 8 containing an implanted concentration of phosphorus with the p-n junction part between the portion 8 and the epitaxial layer 2 extending at a maximum depth in the epitaxial layer 2 of approximately 0.5 microns from the surface 3.

The intermediate n-type region 9 comprises an implanted concentration of phosphorus with the p-n junction between the region 9 and the epitaxial layer 2 extending at a maximum depth of approximately 0.5 micron from the surface 3. Between the adjacent extremities of the source region 5, 6 and the intermediate region 9, that is, between the adjacent extremities of the ion implanted portion 6 of the source region and the ion implanted intermediate region 9 there is a current carrying channel region 16 situated adjacent the surface 3 and having a length which is substantially equal to the corresponding lateral dimension of the overlying gate electrode 14, that is approximately 3 microns. Between the adjacent extremities of the drain regions 7, 8 and the intermediate region 9, that is, between the adjacent extremities of the ion implanted portion 8 of the drain region and the ion implanted intermediate region 9, there is a current carrying channel region 17 adjacent the surface 3 having a length which is substantially equal to the corresponding lateral dimension of the overlying gate electrode 15, that is approximately 3 microns.

The lateral separation of the gate electrodes 14 and 15 in the section shown in FIG. 2 is approximately 4 microns and this corresponds substantially with the length of the intermediate n-type region 9 in the section shown in FIG. 2. The distance between adjacent edges of the source electrode metal layer 11 and the first gate electrode metal layer 14 is approximately 5 microns. Similarly the distance between adjacent edges of the drain electrode metal layer 12 and the second gate electrode metal layer 15 is also approximately 5 microns. The electrode metal layers 11,12,14 and 15 are all of aluminum of approximately 1 micron thickness. The surface concentration of phosphorus in the diffused portion 5 and 7 of the source and drain regions respectively is approximately $10^{20}$ atoms per $cm^3$. The sheet resistivity of the ion implanted portions 6 and 8 of the source and drain regions respectively is approximately 250 ohms per square.

Individual tetrode insulated gate field effect transistor subassemblies are delineated in the wafer by an aperture in the silicon oxide layer in the form of a grid 18 exposing the p-type epitaxial layer 2. Fracture of the wafer to yield a plurality of individual tetrode insulated gate field effect transistor sub-assemblies suitable for further processing by mounting on a substrate, wire bonding and encapsulation is effected along score lines subsequently provided on the surface parts exposed by the grid 18.

Figure 3:
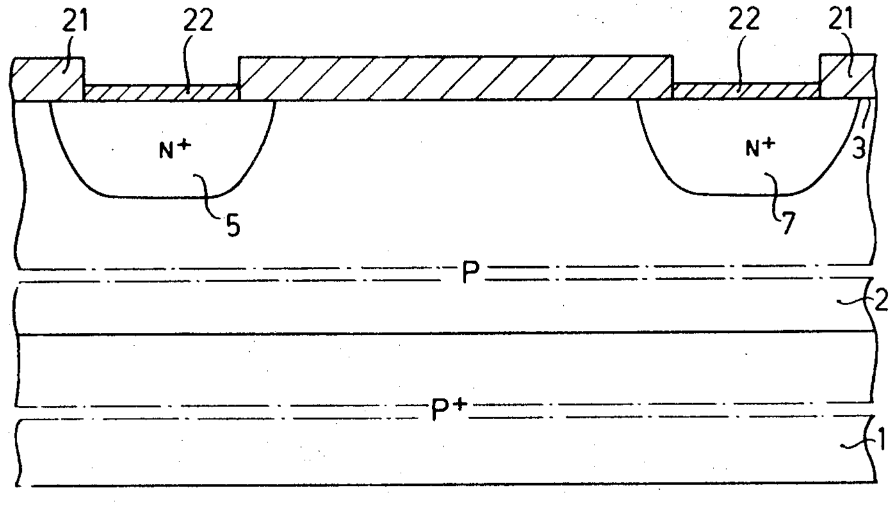
FIGS. 3 to 5 show corresponding cross-sections through the same part of the semiconductor wafer at various stages in the manufacture of the transistor sub-assembly by a method in accordance with the invention.
Figure 4:
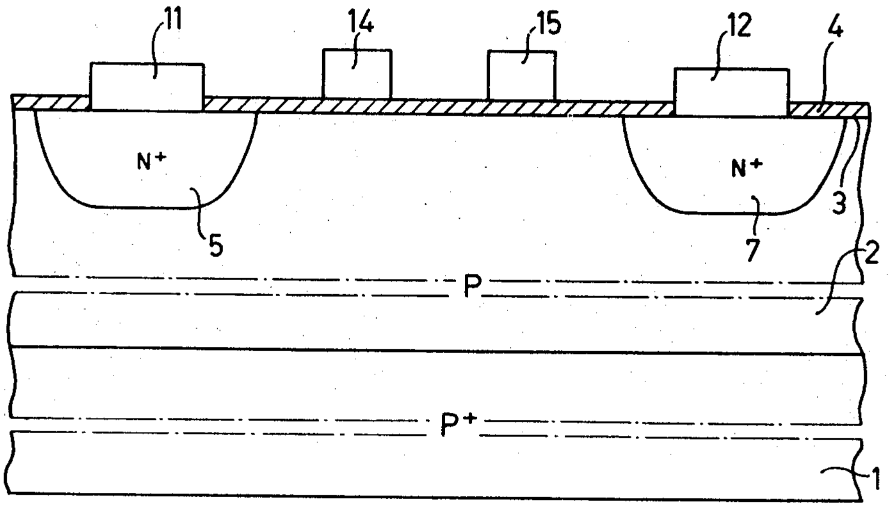

The manufacture of the body shown in FIGS. 1 and 2 will now be described with reference to FIGS. 3 to 5 of the accompanying drawings. The starting material is the $p^+$-type substrate 1 having the 10 micron p-type epitaxial layer thereon. On the surface 3 of the epitaxial layer 2 there is thermally grown a silicon oxide layer 21 of approximately 0.5.micron thickness. Two openings are made in the layer 21 and phosphorus diffused into the exposed surface portions to form the source region portion 5 and the drain region portion 7. During the diffusion a phosphorus containing silicon oxide layer 22 is formed on the exposed portions and the layer 21 is also increased in thickness to a small extent. FIG. 3 shows the semiconductor body after this phosphorus diffusion stage.

The silicon oxide layer 21,22 is then removed by etching and a fresh silicon oxide 4 of approximately 0.1 micron thickness is thermally grown of the surface 3. Apertures are formed on the newly grown silicon oxide layer 4 to expose surface parts of the source region portion 5 and the drain region portion 7. The grid aperture 18 is also formed at this stage. An aluminum layer of approximately 1.0 micron thickness is then deposited over the entire surface. By a photomasking and etching step the aluminum layer is defined to leave the source electrode layer 11 including the bonding pad S, the drain electrode layer 12 including the bonding pad D, the first gate electrode layer 14 including the bonding pad G, and the second gate electrode 15 including the bonding pad $G_2$. The cross-section shown in FIG. 4 shows the semiconductor body after defining the aluminum layer.

Subsequently a continuous thin aluminum layer 23 of less than 0.1 micron thickness is then deposited on the surface of the electrode layers 11,12,14 and 15, in the grid aperture 18 and on the insulating layer parts 4 not covered by said electrode layers.

The silicon body is then placed in the target chamber of an ion implantation apparatus. The implantation of phosphorus ions is effected through the thin aluminum layer 23 and through the insulating layer parts 4 covered directly by the layer 23 but not through the electrode layers 11,12,14 and 15, the latter metal layers acting as a mask and preventing any penetration of ions into the underlying parts of the silicon body. During the implantation the substrate portion 1 of the semiconductor body is connected to an earthing point on the ion accelerator. Thus the metal electrode layers 11,12,14 and 15 are all maintained at earth potential during the ion implantation because the continuous aluminum layer 23 connects all these layer parts together and further connects them to the substrate 1 via the aluminum in the grid aperture 18 forming contact with the epitaxial layer 2. Thus no charging of these electrode layers 11, 12, 14 and 15 can occur during the implantation and thus the properties of the insulating layer, particularly of those parts on which the gate electrodes 14 and 15 are situated are not destroyed during the implantation. As an alternative to providing the grid aperture 18 and aluminum therein, a metal clip may be used to establish the contact between the continuous metal layer 23 and the substrate portion 1. The implantation energy of the phosphorus ions is 100 Kev., the dose is $10^{16}$ ions per sq. cm and the orientation of the silicon body is with the plane of the surface 3, which is orientated according to the 111 direction, 8° away from the normal to the direction of the ion beam. After removal from the ion implantation apparatus the silicon body is subjected to an annealing treatment at approximately 500° C. for 30 minutes in an atmosphere of nitrogen.

Figure 5:
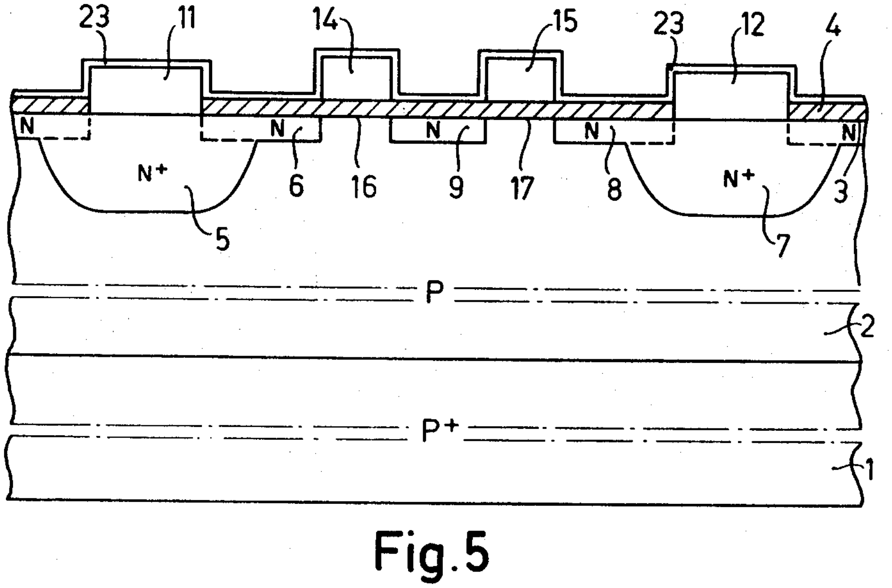

The implantation and annealing result in the structure shown in FIG. 5. The implantation is an Auto-Registration step and forms the source region portion 7, the drain region portion 8 and the intermediate region 9. The current carrying channel regions 16 and 17 are thus defined and due to the very small sideways scattering of the ions these regions have a length which corresponds almost exactly to the lateral dimensions of the gate electrode layers 14 and 15 respectively. Furthermore the provision of the thin aluminum layer also assists in obtaining a channel length which corresponds almost exactly with the lateral dimension of the gate electrode.

Subsequently the thin aluminum layer is removed by a light etching treatment without effecting any substantial removal of the electrode layers 11, 12, 14 and 15. This results in the structure as shown in FIGS. 1 and 2. Thereafter score lines are provided in the grid aperture 18, the wafer is fractured along said score lines and the individual tetrode insulated gate field effect transistors are further processed, including the steps of mounting on a suitable header, wire bonding and encapsulation.

It will be appreciated that many modifications of the method are possible within the scope of the invention as defined in the appended claims. Thus instead of tetrode insulated gate field effect transistors other insulated gate field effect transistors may be manufactured using the method in accordance with the invention, particularly transistors having a complex electrode geometry. Furthermore devices other than insulated gate field effect transistors may be manufactured using the method in accordance with the invention, for example bipolar transistors and semiconductor integrated circuits.

I claim:

1. A method of manufacturing a semiconductor device in which ions of an impurity element are implanted in semiconductor portions of a body to form regions of different electrical properties in the semiconductor portions, which comprises the steps of applying a continuous layer of conductive material over surface parts of said body, connecting said conductive layer to a potential point for maintaining said parts at a common potential during ion implantation, implanting by directing at said continuous conductive layer ions having a given energy sufficient to penetrate the continuous conductive layer so as to pass into portions of the semiconductor to form said regions, and thereafter removing at least part of the continuous conductive layer without substantially effecting any removal of said semiconductor portions including said regions.

2. A method of manufacturing a semiconductor device as claimed in claim 1, wherein during implantation the continuous conductive layer is maintained at the same potential as a substrate portion of the semiconductor.

3. A method of manufacturing a semiconductor device as claimed in claim 1, wherein said parts at which ions are directed include metal electrode layers on top of the body, the applied continuous conductive layer maintaining said electrode layers at a substantially constant potential during ion implantation.

4. A method of manufacturing a semiconductor device as claimed in claim 3, wherein the extent of each metal electrode layer is substantially completely determined prior to applying the continuous conductive layer and the subsequent ion implantation, the removal of the continuous conductive layer after ion implantation re-exposing said metal electrode layers.

5. A method of manufacturing a semiconductor device as claimed in claim 3, wherein the metal electrode layers are of such composition and thickness that the ions of the said given energy practically do not penetrate these layers which act as a mask during ion implantation.

6. A method as claimed in claim 5, wherein on the semiconductor surface situated laterally between the metal electrode layers there is an insulating layer of such composition and thickness that ions of the said given energy which penetrate the overlying continuous conductive layer further penetrate the insulating layer and pass into the semiconductor to form the regions of different electrical properties.

7. A method as claimed in claim 5, wherein the semiconductor device manufactured is an insulated-gate field-effect transistor, the metal electrode layers constituting source and drain electrodes in contact with the semiconductor and at least one gate electrode insulated from the semiconductor, the implantation in the semiconductor of one conductivity type of ions of an impurity element characteristic of the opposite conductivity type being effected to determine the adjacent extremities of source and drain regions of the opposite conductivity type and the location therebetween of at least one current carrying channel region having a length corresponding substantially to the lateral dimension of the overlying insulated gate electrode.

8. A method of manufacturing a semiconductor device as claimed in claim 7, wherein first and second gate electrode metal layers are present on the insulating layer, implantation being effected to determine in the semiconductor of one conductivity type at least the adjacent extremities of the source region and an intermediate region of the opposite conductivity type and the location therebetween of a first current carrying channel region having a length corresponding substantially to the lateral dimension of the overlying, first insulated gate electrode, and to determine in the semiconductor body at least the adjacent extremities of the intermediate region of the opposite conductivity type and the drain region and the location therebetween of a second current carrying channel region having a length corresponding substantially to the lateral dimension of the overlying, second gate electrode.

9. A method of manufacturing a semiconductor device as claimed in claim 8, wherein the implantation is effected to determine substantially completely the intermediate region of the opposite conductivity type.

10. A method of manufacturing a semiconductor device as claimed in claim 7, wherein outer portions of the source and drain regions are determined by a diffusion step prior to applying metal electrode layers and the ion implantation of the impurity element characteristic of the opposite conductivity type is effected to extend these source and drain region portions towards each other in the semiconductor.

11. A method of manufacturing a semiconductor device as claimed in claim 2, wherein electrical contact between the continuous conductive layer and a substrate portion of the semiconductor body is made via a metal clip.

12. A method of manufacturing a semiconductor device as claimed in claim 2, wherein prior to applying the continuous conductive layer a peripheral aperture is formed in an insulating layer on the semiconductor surface to expose a substrate portion of the semiconductor and the continuous conductive layer is applied in said peripheral opening.

13. A method of manufacturing a semiconductor device as claimed in claim 12, wherein the peripheral opening is in the form of a grid in the insulating layer on the semiconductor surface delineating a plurality of semiconductor body parts in each of which an individual circuit element or plurality of interconnected circuit elements are formed.

14. A method of manufacturing a semiconductor device as claimed in claim 1, wherein the continuous conductive layer is of metal.

15. A method of manufacturing a semiconductor device as claimed in claim 3, wherein the applied continuous metal layer and the metal electrode layers are of the same metal, the continuous metal layer having a thickness which is appreciably smaller than that of the metal electrode layer and being removed by etching after the ion implantation.

16. A method of manufacturing a semiconductor device as claimed in claim 15, wherein the semiconductor body is of silicon and the continuous metal layer and the metal electrode layers are of aluminum.

17. A method of manufacturing a semiconductor device as claimed in claim 3, wherein the continuous metal layer is of titanium and the metal electrode layers are of a different metal.

18. A method of manufacturing a semiconductor device as claimed in claim 17, wherein the semiconductor is of silicon and the metal electrode layers consist of a first layer portion of molybdenum and a second layer portion of gold situated on the first layer portion.

19. A method of manufacturing a semiconductor device in which ions of an impurity element are implanted in semiconductor portions of a body to form regions of different electrical properties, which comprises the steps of initially applying over the body parts at which the ions are to be directed a continuous conductive layer, applying over the continuous conductive layer masking material to define said regions, connecting said conductive layer to a potential point for maintaining said parts at a common potential during ion implantation, implanting by directing at said continuous conductive layer ions having a given energy sufficient to penetrate the continuous conductive layer but not the mask so as to pass into portions of the semiconductor to form said regions, and thereafter removing the exposed part of the continuous conductive layer without substantially effecting any removal of said semiconductor including said regions.

20. A method of manufacturing a semiconductor device in which ions of an impurity element are implanted in semiconductor portions of a body to form regions of different electrical properties in the semiconductor portions, which comprises the steps of initially applying masking material on the body to define said regions, then applying a continuous layer of conductive material on the mask and exposed surface portions of said body, connecting said conductive layer to a potential point for maintaining said portions at a common potential during ion implantation, implanting by directing at said continuous conductive layer ions having a given energy sufficient to penetrate the continuous conductive layer but not the mask so as to pass into portions of the semiconductor to form said regions, and thereafter removing at least part of the continuous conductive layer without substantially effecting any removal of said semiconductor portions including said regions.

* * * * *